United States Patent
Jiang et al.

(10) Patent No.: US 11,755,148 B2
(45) Date of Patent: Sep. 12, 2023

(54) TOUCH DETECTION METHOD, TOUCH DETECTION CIRCUIT, TOUCH CHIP AND ELECTRONIC DEVICE

(71) Applicant: SHENZHEN GOODIX TECHNOLOGY CO., LTD., Shenzhen (CN)

(72) Inventors: Hong Jiang, Shenzhen (CN); Guopao Li, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 121 days.

(21) Appl. No.: 17/460,582

(22) Filed: Aug. 30, 2021

(65) Prior Publication Data
US 2021/0389864 A1    Dec. 16, 2021

Related U.S. Application Data

(63) Continuation of application No. PCT/CN2019/116883, filed on Nov. 8, 2019.

(51) Int. Cl.
G06F 3/041 (2006.01)
G06F 3/044 (2006.01)
H03L 7/22 (2006.01)

(52) U.S. Cl.
CPC ........ G06F 3/04184 (2019.05); G06F 3/0446 (2019.05); H03L 7/22 (2013.01); H03L 2207/10 (2013.01)

(58) Field of Classification Search
CPC ............... G06F 3/04184; G06F 3/0446; G06F 3/04182; H03L 7/22; H03L 2207/10
See application file for complete search history.

(56) References Cited

U.S. PATENT DOCUMENTS

| | | | |
|---|---|---|---|
| 10,838,547 B1 * | 11/2020 | Shen | G06F 3/0443 |
| 11,561,644 B2 * | 1/2023 | Komatsu | G06F 3/0443 |
| 2007/0262966 A1 * | 11/2007 | Nishimura | G06F 3/0443 345/173 |

(Continued)

FOREIGN PATENT DOCUMENTS

| | | |
|---|---|---|
| CN | 102981674 A | 3/2013 |
| CN | 103353816 | 10/2013 |

(Continued)

*Primary Examiner* — Amy Onyekaba
(74) *Attorney, Agent, or Firm* — Emerson, Thomson & Bennett, LLC; Roger D. Emerson

(57) ABSTRACT

A touch detection method, a touch detection circuit, a touch chip and an electronic device. The touch detection method includes: receiving a real-time synchronization signal sent by a touch display panel; acquiring a frequency of a noise signal in a working environment of a touch chip; setting a frequency of a coding drive signal based on the frequency of the noise signal, generating the coding drive signal based on the frequency of the coding drive signal, and outputting the coding drive signal to a drive electrode of the touch display panel; generating a strobe signal based on the real-time synchronization signal; and receiving a signal of a sensing electrode of the touch display panel, and outputting a detection result based on the strobe signal and the signal of the sensing electrode.

17 Claims, 7 Drawing Sheets

(56) References Cited

U.S. PATENT DOCUMENTS

| | | | | |
|---|---|---|---|---|
| 2009/0289818 | A1* | 11/2009 | Hou | H03K 17/9622 |
| | | | | 341/33 |
| 2011/0254802 | A1* | 10/2011 | Philipp | G06F 3/04184 |
| | | | | 345/174 |
| 2012/0056834 | A1* | 3/2012 | Kim | G06F 3/04184 |
| | | | | 345/173 |
| 2017/0131823 | A1* | 5/2017 | Dinu | G06F 3/04184 |
| 2017/0147143 | A1 | 5/2017 | Jung | |
| 2018/0004353 | A1* | 1/2018 | Shin | G02F 1/13338 |
| 2018/0032208 | A1* | 2/2018 | Kitagawa | G09G 3/3677 |
| 2018/0181229 | A1* | 6/2018 | Kwon | G09G 3/20 |
| 2019/0056838 | A1* | 2/2019 | Li | G06F 3/04182 |
| 2019/0073062 | A1* | 3/2019 | Li | G06F 3/04182 |
| 2019/0265859 | A1* | 8/2019 | Lin | G09G 3/3648 |
| 2020/0272300 | A1* | 8/2020 | Lee | G06F 3/044 |
| 2021/0191562 | A1* | 6/2021 | Han | G06F 3/04182 |
| 2022/0155938 | A1* | 5/2022 | Hirai | G06F 3/04166 |
| 2022/0276760 | A1* | 9/2022 | Lee | G06F 3/04184 |

FOREIGN PATENT DOCUMENTS

| | | |
|---|---|---|
| CN | 103376961 | 10/2013 |
| CN | 104317446 | 1/2015 |
| CN | 105320319 A | 2/2016 |
| CN | 108345410 | 7/2018 |
| CN | 109324717 | 2/2019 |
| KR | 20170031303 A | 3/2017 |

* cited by examiner

TOUCH DETECTION METHOD, TOUCH DETECTION CIRCUIT, TOUCH CHIP AND ELECTRONIC DEVICE

CROSS-REFERENCE TO RELATED APPLICATIONS

This application is a continuation of International Application No. PCT/CN2019/116883, filed on Nov. 8, 2019, the disclosure of which is hereby incorporated by reference in its entirety.

TECHNICAL FIELD

Embodiments of the present disclosure relate to the field of touch technology, in particular to a touch detection method, a touch detection circuit, a touch chip, and an electronic device.

BACKGROUND

Drive signals of a display usually cause interference to an induction line of a touch sensor, and the interference caused may change with the change of a display screen. Such interference signal may sometimes be very strong. Currently, when a touch chip faces noise signal interference in a working environment and strong drive noise signal interference of display, there is a problem of low touch sensitivity.

SUMMARY

In view of this, embodiments of the present disclosure provide a touch detection method, a touch detection circuit, a touch chip, and an electronic device, to overcome or alleviate the technical problem of low detection sensitivity in the prior art caused by touch detection being disturbed by a display drive interference signal and a noise signal in a working environment of a touch chip.

An embodiment of the present disclosure provides a touch detection method, including: receiving a real-time synchronization signal sent by a touch display panel; acquiring a frequency of a noise signal in a working environment of a touch chip; setting a frequency of a coding drive signal based on the frequency of the noise signal, generating the coding drive signal based on the frequency of the coding drive signal, and outputting the coding drive signal to a drive electrode of the touch display panel; generating a strobe signal based on the real-time synchronization signal; and receiving a signal of a sensing electrode of the touch display panel, and outputting a detection result based on the strobe signal and the signal of the sensing electrode.

An embodiment of the present disclosure provides a touch detection circuit, including: a synchronization signal controller, configured to receive a real-time synchronization signal sent by a touch display panel, and acquire a frequency of a noise signal in a working environment of a touch chip; a coding signal generator, configured to set a frequency of a coding drive signal based on the frequency of the noise signal, generate the coding drive signal based on the frequency of the coding drive signal, and output the coding drive signal to a drive electrode of the touch display panel; and a signal detection strobe, configured to generate a strobe signal based on the real-time synchronization signal, and receive a signal of a sensing electrode of the touch display panel, and output a detection result based on the strobe signal and the signal of the sensing electrode.

An embodiment of the present disclosure provides a touch chip, including the touch detection circuit in any embodiment of the present disclosure.

An embodiment of the present disclosure provides an electronic device, including the touch chip and a touch display panel, the touch chip including the touch detection circuit in any embodiment of the present disclosure and a second PLL frequency multiplier circuit, and the touch display panel including a first PLL frequency multiplier circuit.

In the technical solution provided by the embodiments of the present disclosure, by receiving a real-time synchronization signal sent by a touch display panel; acquiring a frequency of a noise signal in a working environment of a touch chip; setting a frequency of a coding drive signal based on the frequency of the noise signal, generating the coding drive signal based on the frequency of the coding drive signal, and outputting the coding drive signal to a drive electrode of the touch display panel; generating a strobe signal based on the real-time synchronization signal; and receiving a signal of a sensing electrode of the touch display panel, and outputting a detection result based on the strobe signal and the signal of the sensing electrode. Therefore, in the embodiments of the present disclosure, by performing coding and signal detection on the touch sensor in the period that avoids display drive noise, its sensing electrode can not only detect a large effective signal volume, by acquiring the frequency of the noise signal in the working environment of the touch chip, and setting the frequency of the coding drive signal, the received signal is least affected by the noise. The strobe signal is generated in the period that avoids the display drive noise, and the useful signal is detected in a strobe period, so that the touch chip is less affected by a display drive operation of the display, a signal-to-noise ratio of a final detected effective signal is improved, and a touch sensitivity is greatly improved.

BRIEF DESCRIPTION OF THE DRAWINGS

Hereinafter, some specific embodiments of the embodiments of the present disclosure will be described in detail in an exemplary but not restrictive method with reference to the accompanying drawings. The same reference numerals in the accompanying drawings indicate the same or similar components or parts. Those skilled in the art should appreciate that these accompanying drawings are not necessarily drawn to scale. In the accompanying drawings.

DETAILED DESCRIPTION OF EMBODIMENTS

Any technical solution of embodiments of the present disclosure does not necessarily need to achieve all the above advantages at the same time.

Figure 1:
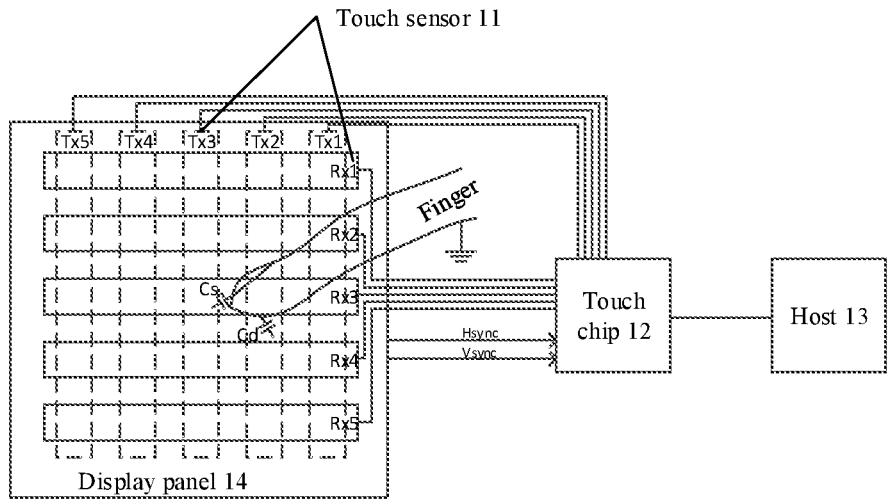
FIG. 1 is a schematic structural diagram of a touch system in an embodiment of the present disclosure.

Referring to FIG. 1, a touch system includes a touch display panel, a touch chip 12 and a host 13, and the touch display panel includes a touch sensor 11 and a display panel 14. The touch sensor 11 has a two-layer structure. Here, a drive layer is called a Tx layer, and a sensing layer is called an Rx layer. The drive layer includes a plurality of drive electrodes Tx1, Tx2, Tx3, etc., and the sensing layer includes a plurality of sensing electrodes Rx1, Rx2, Rx3, etc., below the drive layer and the sensing layer is the display panel 14. A drive interference signal of the display panel 14 may affect the drive layer and a sensing accuracy of the sensing layer, especially for a display panel of Y-OCTA technology, because the technology makes the touch sensor 11 and the display panel 14 together into a touch display panel at one time, the display panel 14 is closer to the drive layer and the sensing layer, and the display panel 14 greatly affects the drive layer and the sensing accuracy of the sensing layer, resulting in a more significant decrease in a touch sensitivity.

In the technical solution provided by the embodiments of the present disclosure, by receiving a real-time synchronization signal sent by a touch display panel; acquiring a frequency of a noise signal in a working environment of a touch chip; setting a frequency of a coding drive signal based on the frequency of the noise signal, generating the coding drive signal based on the frequency of the coding drive signal, and outputting the coding drive signal to a drive electrode of the touch display panel; generating a strobe signal based on the real-time synchronization signal; and receiving a signal of a sensing electrode of the touch display panel, and outputting a detection result based on the strobe signal and the signal of the sensing electrode. Therefore, in the embodiments of the present disclosure, by performing signal detection on the touch sensor in the period that avoids display drive noise, and setting the frequency of the coding drive signal based on a change in the noise signal in the working environment of the touch chip, it greatly avoids the influence of the noise signal in the working environment of the touch chip and an influence of a display drive noise signal, so that the touch chip can not only detect a large effective signal volume, but also improve a signal-to-noise ratio of a final detected effective signal, and greatly improve a touch sensitivity.

Specific implementations of the embodiments of the present disclosure will be further described below in conjunction with the accompanying drawings of the embodiments of the present disclosure.

Figure 2:
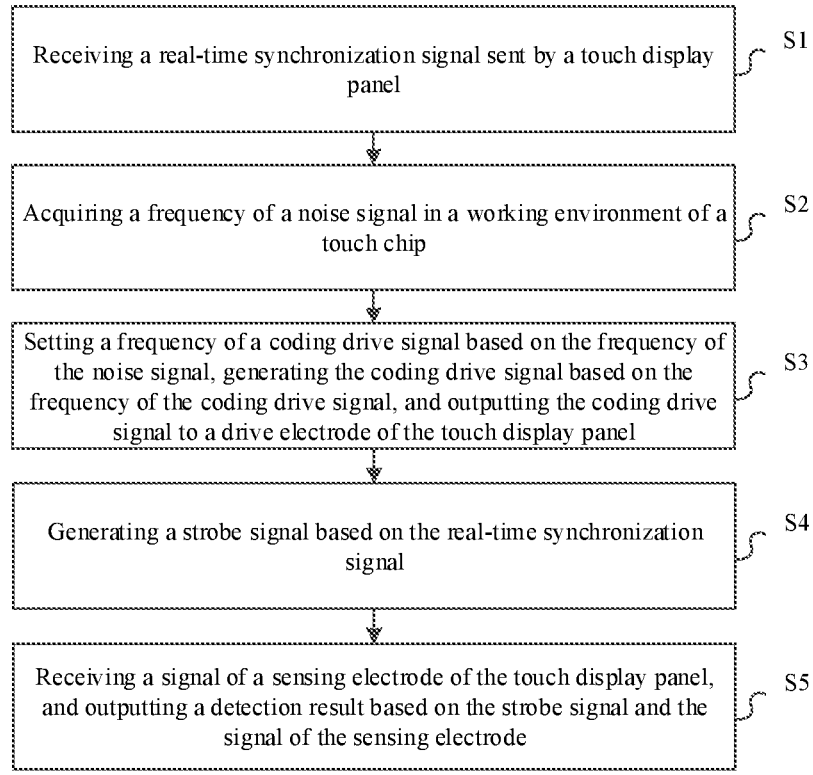
FIG. 2 is a flowchart of a touch detection method in an embodiment of the present disclosure.

FIG. 2 is a flowchart of a touch detection method for a touch display panel according to an embodiment of the present disclosure.

The method includes:

S1, receiving a real-time synchronization signal sent by a touch display panel.

Figure 3A:
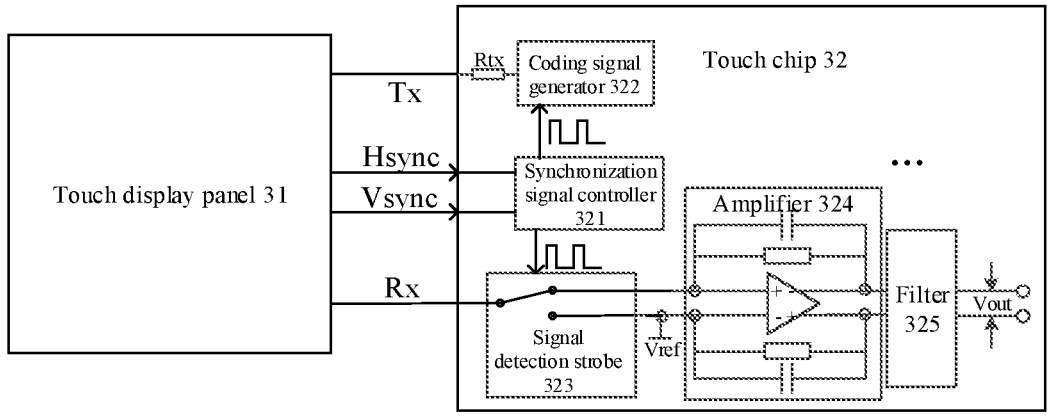
FIG. 3a is a circuit diagram of a touch detection circuit in an embodiment of the present disclosure.
Figure 3B:
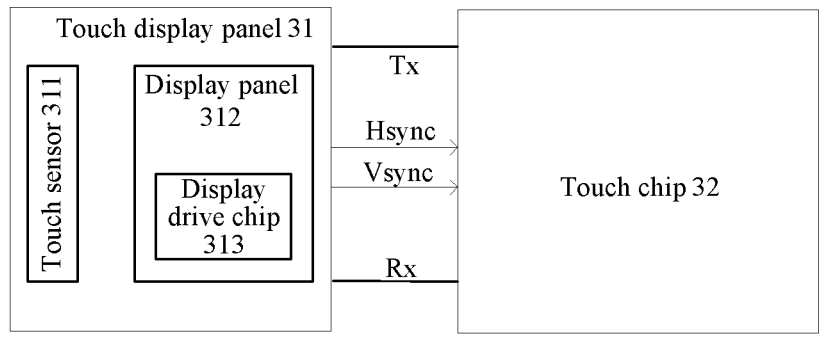
FIG. 3b is a schematic structural diagram of a touch display panel in an embodiment of the present disclosure.

Referring to FIGS. 3a and 3b, a touch display panel 31 according to an embodiment of the present disclosure includes a touch sensor 311, a display panel 312, and a display drive chip 313. The display drive chip 313 sends a real-time synchronization signal to a touch chip 32, the display drive chip 313 is connected to the display panel 312, and the display panel 312 is coupled to the touch sensor 311. The touch chip 32 includes a synchronization signal controller 321, a coding signal generator 322 and a signal detection strobe 323. The synchronization signal controller 321 receives the real-time synchronization signal sent by the display drive chip 313 in the touch display panel 31.

The real-time synchronization signal (sync) includes: a horizontal real-time synchronization signal (Hsync) that is correlated with a noise signal and a vertical real-time synchronization signal (Vsync) that controls a refresh rate.

Specifically, the real-time synchronization signal (sync) in the present disclosure adopts the horizontal real-time synchronization signal (Hsync). Based on the real-time synchronization signal, a trigger signal in a period that avoids display drive noise is generated, and the trigger signal can trigger a system operation in the period that avoids the display drive noise.

S2, acquiring a frequency of a noise signal in a working environment of a touch chip.

When the touch chip cooperates with a touch screen to complete a touch operation, if the working environment of the touch chip contains loud noise, such as LCD noise of the touch screen, and a frequency of the noise is equal to a frequency of a coding drive signal, it may affect normal operation of the touch chip. For example, the touch chip cannot accurately calculate touch coordinates or there are many errors in the calculation of the touch coordinates. Therefore, the noise signal in the working environment of the touch chip may be detected in advance to avoid those high-noise frequency points, and a low-noise frequency may be selected as the frequency of the coding drive signal.

In a specific embodiment of the present disclosure, step S2 includes:

S21, acquiring frequencies of noise signals in a working environment of a touch chip.

S22, detecting intensities of the noise signals at each frequency in the working environment of the touch chip, and setting a frequency of a noise signal a intensity of which is lower than a preset intensity threshold in the detected noise signals as the frequency of the coding drive signal.

Figure 12:
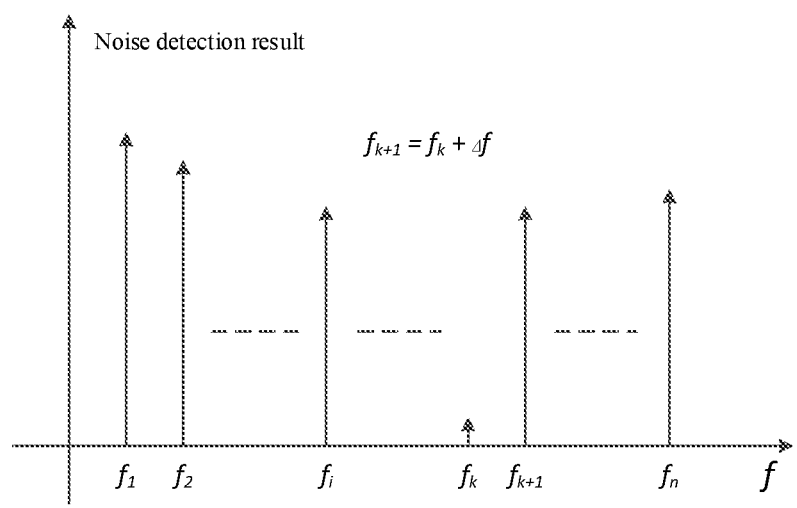
FIG. 12 is a noise distribution diagram obtained by a noise detection module in an embodiment of the present disclosure.

Specifically, referring to FIG. 12, FIG. 12 is a noise distribution diagram obtained by a noise detection module in some embodiments of the present disclosure. In the present embodiment, before the coding signal generator outputs a coding signal, noise information in the working environment of the touch chip is detected to acquire the noise signal. The touch chip detects that there are large noise signals at frequency points f1, f2, fi, fk+1, and fn, which need to be avoided. The noise signal at the frequency point fk is small, and the frequency point fk may be used as the frequency of the coding drive signal.

Specifically, in order to set the frequency of the coding drive signal output by the coding signal generator 322 to be the best, the intensity of the noise signal detected at each frequency in the working environment of the touch chip may be compared with the preset intensity threshold. Specifically, selecting the frequency point with the lowest noise as a frequency of the coding signal output by the coding signal generator may be realized by a comparison function. Assuming that a set of frequency points in the working environment of the touch chip is {f1, f2, . . . fi, . . . fn}, set the noise intensity at the frequency points of f1, f2, . . . fi, . . . fn as P(f1), P(f2), . . . P(fi), P(fn), and set a variable Min. First set Min=P(f1), then let Min be compared with P(f2), . . . P(fi), P(fn) respectively. When Min is greater than any one of P(fk), set Min equal to the P(fk). Then, compare the modified Min with the remaining noise intensity until the end of comparison with P(fn). In this regard, the frequency corresponding to Min is the frequency with the lowest noise, and the frequency of the noise signal is set as the frequency of the coding drive signal output by the coding signal generator.

In the present embodiment, the frequency of the lowest noise is set as the frequency of the coding drive signal output by the coding signal generator 322, thereby further reducing the influence of noise in the working environment of the touch chip on touch detection, and improving an accuracy of touch coordinate information calculated by the touch chip.

It should be noted that the definition of the noise intensity in any one of the above embodiments may be to convert noise into a corresponding electrical signal, and use some parameters of the noise electrical signal as a quantity to represent the noise intensity, such as voltage, energy, variance or power.

The coding signal generator 322 outputs the coding drive signal at different frequencies to switch an operating frequency, which is achieved by frequency hopping, and there may be many methods of frequency hopping. The present embodiment may also be implemented using a frequency hopping function, where the frequency hopping function is defined as fi+1=next(fi). fi is the frequency at which the coding signal generator 322 outputs the coding drive signal for the $i^{th}$ time. fi+1 is the frequency at which the coding signal generator 322 outputs the coding drive signal for the $i+1^{th}$ time. Next is a frequency hopping algorithm function, which specifies a rule to hop from fi to fi+1.

Figure 4:
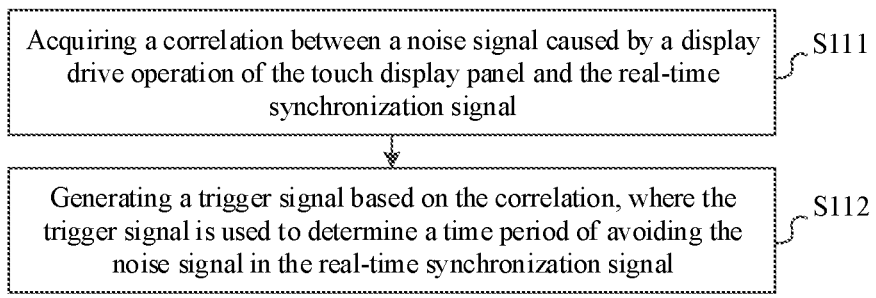
FIG. 4 is a partial flowchart of a touch detection method in an embodiment of the present disclosure.

The present disclosure provides an embodiment. Referring to FIG. 4, the touch detection method further includes:

S111, acquiring a correlation between a noise signal caused by a display drive operation of the touch display panel and the real-time synchronization signal.

Specifically, the real-time synchronization signal (sync) in the present disclosure adopts the horizontal real-time synchronization signal (Hsync). The present disclosure determines a trigger time point of the trigger signal by a relationship between the noise signal caused by the display drive operation and the horizontal real-time synchronization signal (Hsync).

Figure 5:
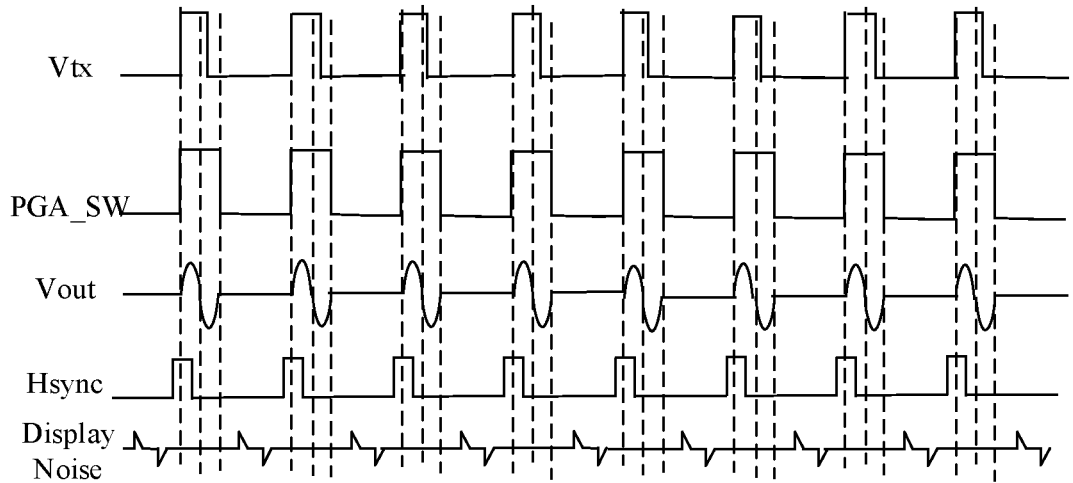
FIG. 5 is a schematic diagram showing a time sequence of an association relationship of same-frequency signals in an embodiment of the present disclosure.

Referring to FIG. 5, in the touch display panel, when a display data signal changes, noise caused by the display drive operation may occur, as shown by a noise signal (Display noise) waveform. A time-domain distribution of the noise signal (Display noise) waveform is strongly correlated with the horizontal real-time synchronization signal (Hsync). The correlation includes that an edge position of the noise signal (Display noise) relative to the horizontal real-time synchronization signal (Hsync) is fixed and concentrated. Therefore, there is a period of time including the noise signal (Display noise) in a period of each horizontal real-time synchronization signal (Hsync).

However, the correlation is not limited to the edge position of the noise signal (Display noise) relative to the horizontal real-time synchronization signal (Hsync) being fixed and concentrated, but also includes other correlations of the noise signal (Display Noise) relative to the horizontal real-time synchronization signal (Hsync), such as the noise signal (Display Noise) is relatively fixed and concentrated in a certain waveform to the horizontal real-time synchronization signal (Hsync), or a certain waveform of the noise signal (Display Noise) relative to the horizontal real-time synchronization signal (Hsync) has a similar waveform, which is not limited in the present disclosure.

S112, generating a trigger signal based on the correlation, where the trigger signal is used to determine a time period that avoids the noise signal in the real-time synchronization signal.

The present disclosure uses the time period that avoids the noise signal in the period of the real-time synchronization signal to trigger to generate the coding drive signal and to detect a signal of the touch sensor, so the trigger signal generates a trigger operation in the time period that avoids the noise signal in the period of the horizontal real-time synchronization signal Hsync.

Figure 9:
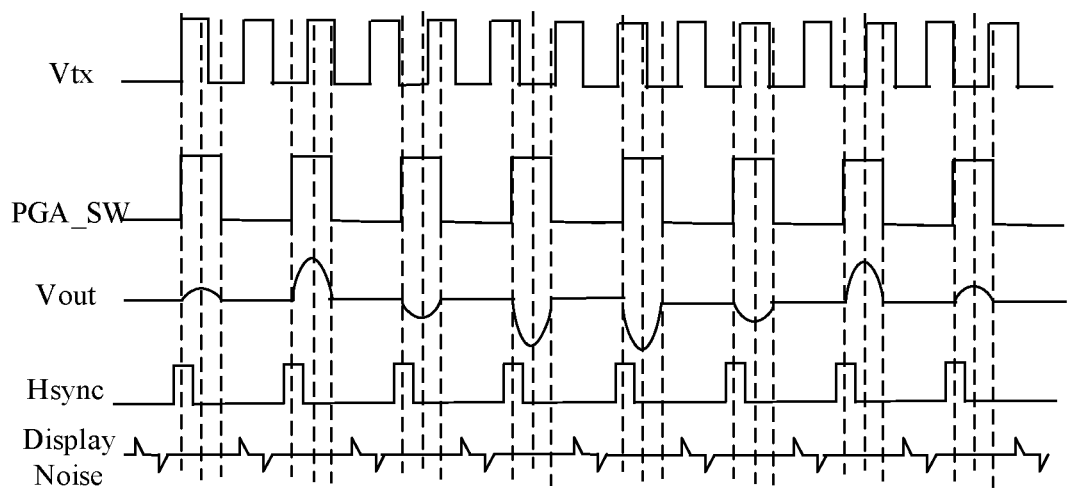
FIG. 9 is a schematic diagram showing a time sequence of an association relationship of frequency hopping signals in an embodiment of the present disclosure.

Referring to FIG. 9, the strobe signal PGA_SW has the same frequency as the horizontal real-time synchronization signal (Hsync), and a width of a single high-level interval of the strobe signal PGA_SW is greater than a width of a single high-level interval of the horizontal real-time synchronization signal (Hsync). A rising edge of the horizontal real-time synchronization signal is external to a strobe interval of the strobe signal. The strobe interval is a time period during which a useful signal is connected to an input terminal of an amplifier circuit, and the amplifier circuit outputs a non-zero level. The strobe signal PGA_SW is triggered by the trigger signal after a period of time delay from a high level of the horizontal synchronization signal (Hsync) to generate a high and low-level waveform, so that high and low-levels of the strobe signal PGA_SW avoid the noise signal (Display Noise) caused by the display drive operation, that is, a noise waveform of the noise signal (Display Noise) coincides with a low-level interval timing of the strobe signal PGA_SW, so that the coding drive signal Vtx avoids the noise signal (Display Noise) caused by the display drive operation, and is not affected by the noise signal (Display Noise) caused by the display drive operation. Since the frequency of the coding drive signal Vtx is set to the frequency of the lowest noise in the working environment of the touch chip at the same time, it not only avoids the influence of noise caused by the display drive operation, but also avoids the influence of other noises in the working environment of the touch chip, improving the signal-to-noise ratio of the final detected effective signal, and greatly improving the touch sensitivity. The difference between FIG. 9 and FIG. 5 is that in FIG. 5, the frequency of the coding drive signal Vtx output by the coding signal generator 322 is the same as the frequency of the strobe signal, while in FIG. 9, the frequency of the coding drive signal Vtx output by the coding signal generator 322 may be different from the frequency of the strobe signal. The frequency of the coding drive signal Vtx may be changed in real time based on the frequency of the smallest noise signal in the working environment of the touch chip.

S3, setting a frequency of a coding drive signal based on the frequency of the noise signal, generating the coding drive signal based on the frequency of the coding drive signal, and outputting the coding drive signal to a drive electrode of the touch display panel.

Specifically, referring to FIG. 3a, the coding signal generator 322 according to an embodiment of the present disclosure triggers to generate the coding drive signal Vtx under the control of the trigger signal, and adjusts a duty ratio of the coding drive signal Vtx, preferably, the duty ratio of the output Vtx is 50%, and Vtx may be a square wave waveform, as shown in FIG. 5. The touch chip outputs the coding drive signal Vtx to the drive electrode of the touch display panel to drive the drive electrode to scan the touch display panel.

In a specific embodiment of the present disclosure, step S3 includes:

generating the coding drive signal based on the trigger signal.

Specifically, under the control of the trigger signal, the coding signal generator 322 according to an embodiment of the present disclosure triggers to generate the coding drive signal Vtx, and the frequency of the coding drive signal Vtx generated by the coding signal generator 322 is the frequency of the lowest noise in the working environment of the touch chip.

S4, generating a strobe signal based on the real-time synchronization signal.

In an embodiment of the present disclosure, based on the real-time synchronization signal, the synchronization signal controller 321 generates the trigger signal, and the signal detection strobe 323 triggers to generate the strobe signal PGA_SW having the high and low levels under the control of the trigger signal. Referring to FIGS. 5 and 9, one frame vertical synchronization signal corresponds to a plurality of horizontal synchronization signals (Hsync), the strobe signal PGA_SW has the same frequency as the horizontal real-time synchronization signal, the width of the single high-level interval of the strobe signal PGA_SW is greater than the width of the single high-level interval of the horizontal real-time synchronization signal, and the rising edge of the horizontal real-time synchronization signal is external to the strobe interval of the strobe signal PGA_SW. The strobe signal PGA_SW is delayed for a period of time by the rising edge of the horizontal synchronization signal (Hsync), and then is triggered by the trigger signal to generate the high and low-level waveform. The strobe signal PGA_SW is in a low-level period, and the low-level period includes a time period of the display drive noise, so that a signal value output by the touch sensor in the touch display panel is 0; the strobe signal PGA_SW is in a high-level period, and the high-level period corresponds to a non-noise time period of the display drive, so that the touch chip detects the signal value of the touch sensor in the touch display panel. The high-level period of the horizontal synchronization signal (Hsync) avoids the noise signal (Display Noise) caused by the display drive operation, so that the detection of a capacitance signal of the touch sensor avoids the noise signal (Display Noise) caused by the display drive operation, and may not be affected by the noise signal (Display Noise) caused by the display drive operation.

S5, receiving a signal of a sensing electrode of the touch display panel, and outputting a detection result based on the strobe signal and the signal of the sensing electrode.

Specifically, an embodiment of the present disclosure uses the strobe signal PGA_SW to control whether to perform detection on a signal value of a capacitance sensor. Referring to FIG. 3a, the signal detection strobe 323 according to an embodiment of the present disclosure receives the signal of the sensing electrode of the touch display panel, and under the control of the trigger signal, the signal detection strobe 323 generates the strobe signal PGA_SW in the period that avoids the display drive noise, and detects the signal of the touch sensor in the period that avoids the display drive noise; and in a display drive noise period, detection is not performed on the signal of the touch sensor, and the output is 0.

A drive electrode Tx in the touch display panel 31 is driven by the coding drive signal Vtx. A coupling capacitance of the drive electrode Tx and a sensing electrode Rx in the touch display panel 31 changes due to a user's touch, that is, the signal of the touch sensor in the touch display panel. The signal of the touch sensor in the touch display panel is strobed for detection by the signal detection strobe 323 in the touch chip 32 to obtain a waveform part of an output signal Vout. Therefore, coordinates of a user touch position in the touch display panel 31 are obtained based on the output signal Vout.

Figure 6:
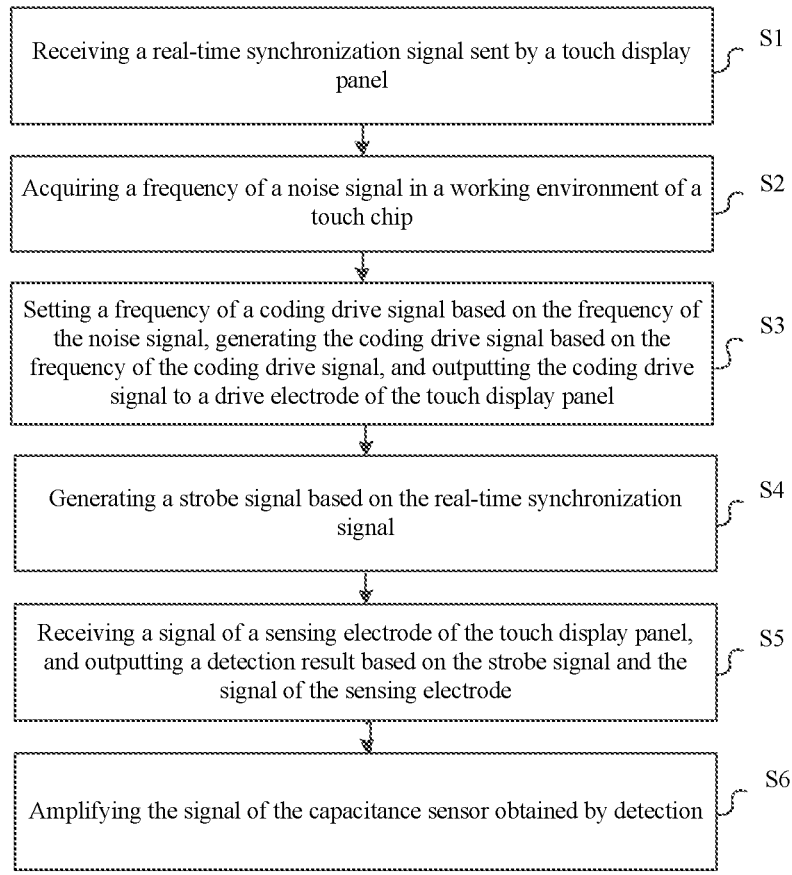
FIG. 6 is a flowchart of a touch detection method for a touch display panel in another embodiment of the present disclosure.

In another specific embodiment of the present disclosure, referring to FIG. 6, the method further includes:

S6, amplifying the signal of the capacitance sensor obtained by detection.

A programmable gain amplifier PGA is usually used to amplify the obtained signal value of the capacitance sensor, and its circuit design is simple and the cost is low.

Specifically, referring to FIGS. 3a and 3b, the programmable gain amplifier PGA receives the signal value of the capacitance sensor strobed by the strobe signal PGA_SW, and the programmable gain amplifier PGA amplifies the obtained signal value of the capacitance sensor.

Of course, other amplifiers may also be used in the present disclosure to amplify the obtained signal value of the capacitance sensor, which is not limited in the present disclosure.

Figure 7:
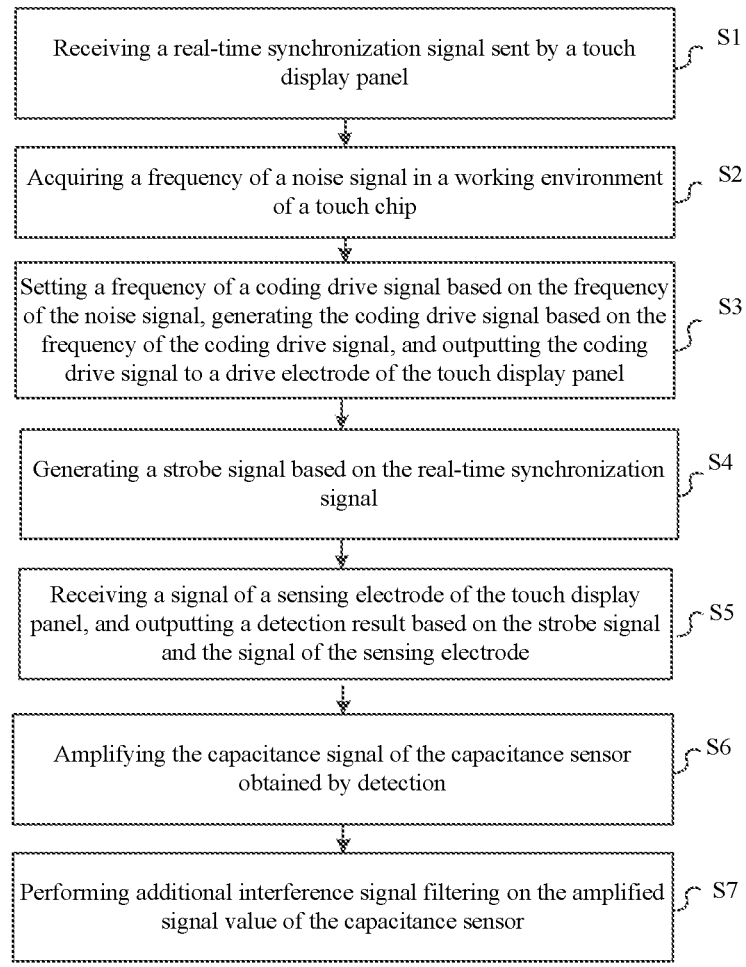
FIG. 7 is a flowchart of a touch detection method for a touch display panel in yet another embodiment of the present disclosure.

In another specific embodiment of the present disclosure, referring to FIG. 7, the method further includes:

S7, performing additional interference signal filtering on the amplified signal value of the capacitance sensor.

Typically, a low-pass anti-alias filter circuit AAF is used to perform additional interference signal filtering on the amplified signal value of the capacitance sensor, and its circuit design is simple and the cost is low.

Specifically, referring to FIG. 3a, the low-pass anti-alias filter circuit AAF performs additional interference signal filtering on the amplified signal value of the capacitance sensor.

Of course, other filters may also be used in the present disclosure to filter the interference signal of the obtained signal value of the capacitance sensor, which is not limited in the present disclosure.

Referring to FIGS. 3a and 3b, the touch display panel 31 according to an embodiment of the present disclosure includes the touch sensor 311, the display panel 312, and the display drive chip 313. The display drive chip 313 sends the real-time synchronization signal, the touch sensor 311 is coupled to the drive layer Tx and the sensing layer Rx, the display drive chip 313 is coupled to the display panel 312, and the display panel 312 is coupled to the touch sensor 311.

In another specific embodiment of the present disclosure, the method further includes:

receiving clock information external to the touch display panel and the touch chip, where the clock information is used to synchronize the strobe signal and the real-time synchronization signal.

Figure 10:
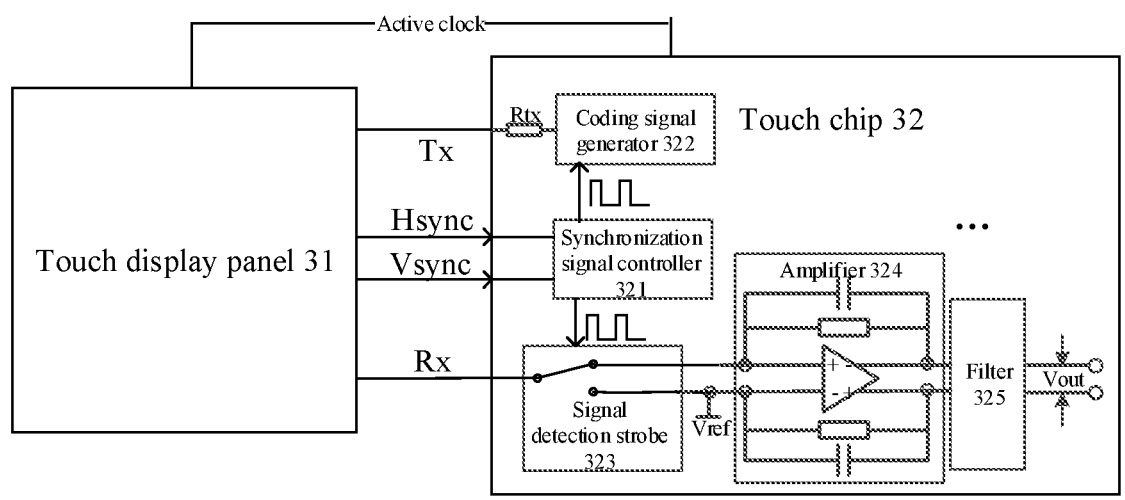
FIG. 10 is a circuit diagram of a touch detection circuit in another embodiment of the present disclosure.
Figure 11A:
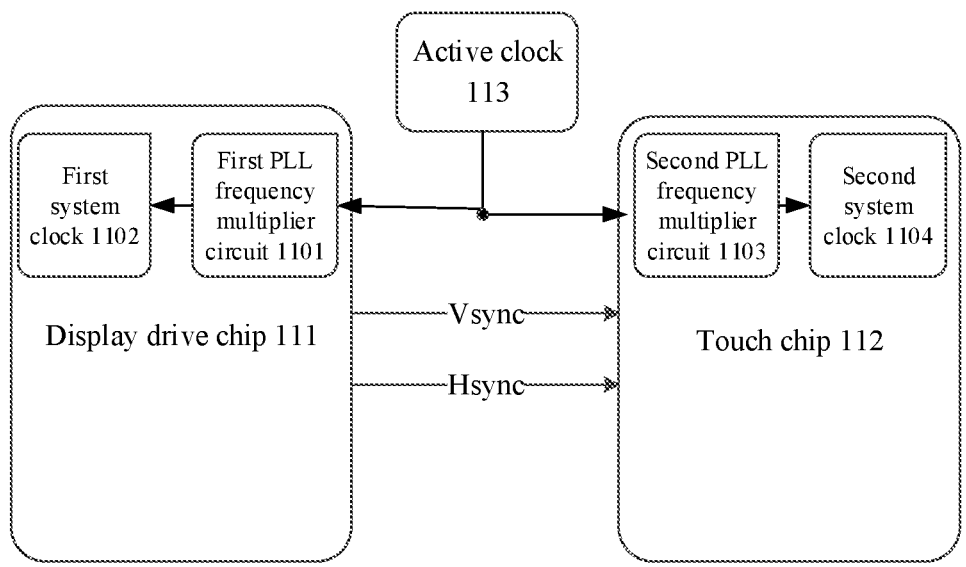
FIG. 11a is a schematic structural diagram of a common active clock between a touch display panel and a touch chip in an embodiment of the present disclosure.

Specifically, referring to FIG. 10, an active clock is provided external to the touch chip 32 and the touch display panel 31, and the active clock may be a crystal oscillator. Refer to FIG. 11a, the active clock is connected to a second PLL (hase-locked-loop) frequency multiplier circuit 1103 of a touch chip 112 and a first PLL frequency multiplier circuit 1101 of a display drive chip 111. The second PLL frequency multiplier circuit 1103 of the touch chip 112 is connected to a second system clock 1104 of the touch chip 112, and the first PLL frequency multiplier circuit 1101 of the display drive chip 111 is connected to a first system clock 1102 of the display drive chip 111. The touch chip 112 and the display drive chip 111 receive the external clock information, and the clock information is used to synchronize the strobe signal and the real-time synchronization signal.

In another specific embodiment of the present disclosure, the method further includes:

receiving clock information of the touch display panel, where the clock information is used to synchronize the strobe signal and the real-time synchronization signal.

Figure 11B:
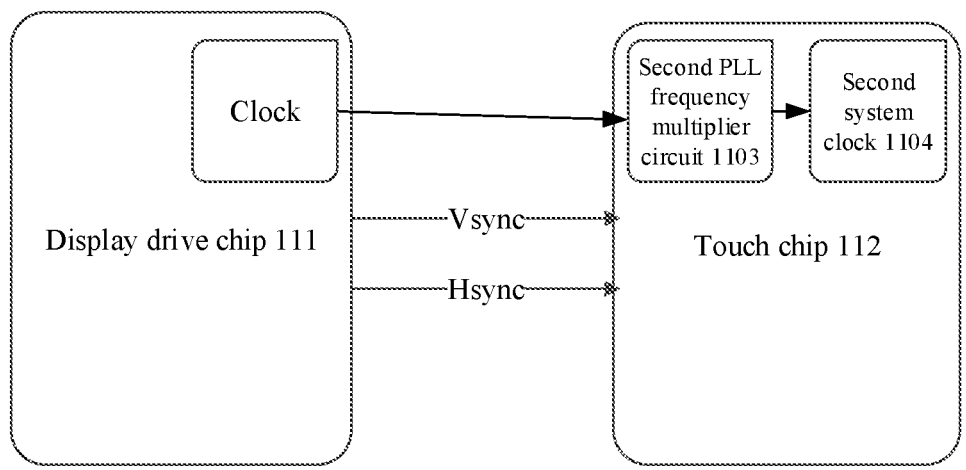
FIG. 11b is a schematic structural diagram of a common active clock between a touch display panel and a touch chip in another embodiment of the present disclosure.

Specifically, referring to FIG. 11b, the touch chip 112 includes the second PLL frequency multiplier circuit 1103 and the second system clock 1104; the touch display panel includes the display drive chip 111, the touch chip 112 includes the second PLL frequency multiplier circuit 1103 and the second system clock 1104, the display drive chip 111 outputs the clock information to the second PLL frequency multiplier circuit 1103, and the second PLL frequency multiplier circuit 1103 is connected to the second system clock 1104. The touch chip 112 receives the clock information of the display drive chip 111, and the clock information is used to synchronize the strobe signal and the real-time synchronization signal.

In another specific embodiment of the present disclosure, the method further includes:

outputting clock information to the touch display panel, where the clock information is used to synchronize the strobe signal and the horizontal synchronization signal.

Figure 11C:
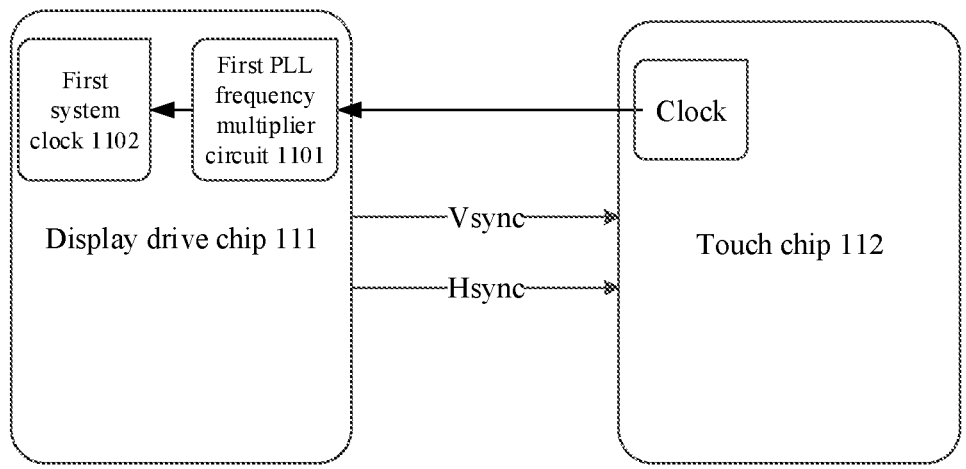
FIG. 11c is a schematic structural diagram of a common active clock between a touch display panel and a touch chip in another embodiment of the present disclosure.

Specifically, referring to FIG. 11c, the display drive chip 111 includes the first PLL frequency multiplier circuit 1101 and the first system clock 1102; the touch chip 112 outputs the clock information to the first PLL frequency multiplier circuit 1101, and the first PLL frequency multiplier circuit 1101 is connected to the first system clock 1102. The touch chip 112 outputs the clock information to the display drive chip 111, and the clock information is used to synchronize the strobe signal and the real-time synchronization signal.

In an embodiment of the present disclosure, referring to FIG. 3a and FIG. 3b, the touch detection circuit includes:

a synchronization signal controller 321, configured to receive a real-time synchronization signal sent by a touch display panel, and acquire a frequency of a noise signal in a working environment of a touch chip;

a coding signal generator 322, configured to set a frequency of a coding drive signal based on the frequency of the noise signal, generate the coding drive signal based on the frequency of the coding drive signal, and output the coding drive signal to a drive electrode of the touch display panel; and a signal detection strobe 323, configured to generate a strobe signal based on the real-time synchronization signal, and receive a signal of a sensing electrode of the touch display panel, and output a detection result based on the strobe signal and the signal of the sensing electrode.

The synchronization signal controller 321 receives the real-time synchronization signal sent by a display panel in the touch display panel 31.

In a specific implementation of the present disclosure, the real-time synchronization signal is a horizontal real-time synchronization signal. The real-time synchronization signal (sync) includes the horizontal real-time synchronization signal (Hsync) that is correlated with a noise signal and a vertical real-time synchronization signal (Vsync) that controls a refresh rate.

Specifically, the real-time synchronization signal (sync) in the present disclosure adopts the horizontal real-time synchronization signal (Hsync). The present disclosure determines a trigger time point of the trigger signal by a relationship between the noise signal caused by the display drive operation and the horizontal real-time synchronization signal (Hsync).

In a specific implementation of the present disclosure, referring to FIG. 10, the synchronization signal controller 321 is further configured to acquire frequencies of noise signals in a working environment of a touch chip; detect intensities of the noise signals at each frequency in the working environment of the touch chip, and set a frequency of a noise signal a intensity of which is lower than a preset intensity threshold in the detectenoise signals as the frequency of the coding drive signal.

When the touch chip cooperates with a touch screen to complete a touch operation, if the working environment of the touch chip contains loud noise, such as LCD noise of the touch screen, and a frequency of the noise is equal to a frequency of a coding drive signal, it may affect normal operation of the touch chip. For example, the touch chip cannot accurately calculate touch coordinates or there are many errors in the calculation of the touch coordinates. Therefore, the noise signal in the working environment of the touch chip may be detected in advance to avoid those high-noise frequency points, and a low-noise frequency may be selected as the frequency of the coding drive signal.

Specifically, referring to FIG. 12, FIG. 12 is a noise distribution diagram obtained by a noise detection module in some embodiments of the present disclosure. In the present embodiment, before the coding signal generator outputs a coding signal, noise information in the working environment of the touch chip is detected to acquire the noise signal. The touch chip detects that there are large noise signals at frequency points f1, f2, fi, fk+1, and fn, which need to be avoided. The noise signal at the frequency point fk is small, and the frequency point fk may be used as the frequency of the coding drive signal.

In a specific implementation of the present disclosure, the strobe signal has the same frequency as the horizontal real-time synchronization signal.

In a specific implementation of the present disclosure, a width of a single high-level interval of the strobe signal is greater than a width of a single high-level interval of the horizontal real-time synchronization signal.

In a specific implementation of the present disclosure, a rising edge of the horizontal real-time synchronization signal is external to a strobe interval of the strobe signal.

In a specific implementation of the present disclosure, detecting an intensity of the noise signal at each frequency in the working environment of the touch chip, and setting a frequency of a noise signal that is lower than a preset intensity threshold in the detected intensity of the noise signal as the frequency of the coding drive signal.

Specifically, in order to set the frequency of the coding drive signal output by the coding signal generator 322 to be the best, the intensity of the noise signal detected at each frequency in the working environment of the touch chip may be compared with the preset intensity threshold. Specifically, selecting the frequency point with the lowest noise as a frequency of the coding signal output by the coding signal generator may be realized by a comparison function. Assuming that a set of frequency points in the working environment of the touch chip is {f1, f2, . . . fi, . . . fn}, set the noise intensity at the frequency points of f1, f2, . . . fi, . . . fn as P(f1), P(f2), . . . P(fi), P(fn), and set a variable Min. First set Min=P(f1), then let Min be compared with P(f2), . . . P(fi), P(fn) respectively. When Min is greater than any one of P(fk), set Min equal to the P(fk). Then, compare the modified Min with the remaining noise intensity until the end of comparison with P(fn). In this regard, the frequency corresponding to Min is the frequency with the lowest noise, and the frequency of the noise signal is set as the frequency of the coding drive signal output by the coding signal generator.

In the present embodiment, the frequency of the lowest noise is set as the frequency of the coding drive signal output by the coding signal generator 322, thereby further reducing the influence of noise in the working environment of the touch chip on touch detection, and improving an accuracy of touch coordinate information calculated by the touch chip.

Figure 8:
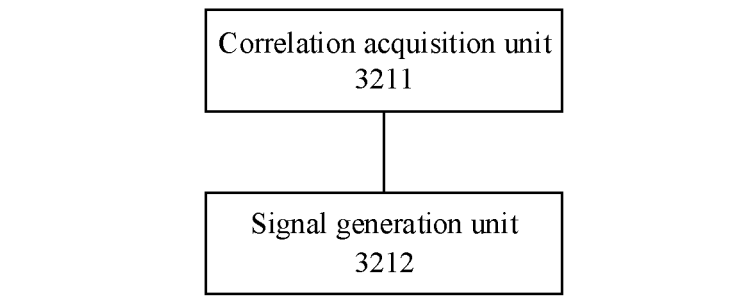
FIG. 8 is a schematic structural diagram of a synchronization signal controller of a touch detection circuit in yet another embodiment.

In a specific implementation of the present disclosure, referring to FIG. 8, the synchronization signal controller 321 includes:

A correlation acquisition unit 3211, is configured to acquire a correlation between a noise signal caused by a display drive operation of the touch display panel and the real-time synchronization signal.

A signal generation unit 3212, is configured to generate a trigger signal based on the correlation, where the trigger signal is used to determine a time period that avoids the noise signal in the real-time synchronization signal.

In a specific implementation of the present disclosure, the signal detection strobe 323 is further configured to:

trigger to generate the strobe signal in the time period that avoids the noise signal in the real-time synchronization signal, based on the trigger signal.

In a specific implementation of the present disclosure, the correlation includes that an edge position of the noise signal relative to the horizontal real-time synchronization signal is fixed and concentrated.

In a specific implementation of the present disclosure, referring to FIG. 10, the circuit further includes:

an amplifier 324, configured to amplify a signal of the touch sensor obtained by detection; and a low-pass anti-alias filter 325, configured to perform additional interference signal filtering on the amplified signal of the touch sensor.

In a specific implementation of the present disclosure, referring to FIG. 3a, the signal detection strobe 323 is further configured to:

strobe and connect a useful signal of the touch sensor in the touch display panel to an input terminal of an amplifier circuit, where the amplifier circuit outputs a non-zero level; and strobe and connect a noise signal of the touch sensor in the touch display panel to another input terminal of the amplifier circuit, where the another input terminal of the amplifier circuit is connected to a reference voltage, and an output terminal of the amplifier circuit is at zero level.

Referring to FIG. 3a, in the present disclosure, in a display drive noise period, the signal detection strobe 323 includes a differential circuit. The signal detection strobe 323 strobes and connects a signal value of a capacitance sensor to one input terminal of the differential circuit, and the other input terminal of the differential circuit inputs a reference voltage Vref, so that an output terminal of the differential circuit is at zero level, so that an output signal Vout in the display drive noise period is at zero level. In an embodiment of the present disclosure, the useful signal of the touch sensor in the touch display panel is strobed and connected to one input terminal of the amplifier circuit, and the amplifier circuit outputs a non-zero level; the noise signal of the touch sensor in the touch display panel is strobed and connected to another input terminal of the amplifier circuit, where the another input terminal of the amplifier circuit is connected to the reference voltage, and the output terminal of the amplifier circuit is at zero level. The differential circuit according to the present disclosure does not include a buffer, which can further reduce the influence of noise caused by the buffer.

An embodiment of the present disclosure also provides a touch chip, including the touch detection circuit in any embodiment of the present disclosure.

Under normal circumstances, the display drive chip uses an on-chip RC oscillator as an active clock, and a temperature drift and jitter of the horizontal synchronization signal output by the active clock are large. Because a center frequency of the horizontal synchronization signal floats, the horizontal synchronization signal is not synchronized with the rising edge of the vertical synchronization signal, so that the strobe signal and the horizontal synchronization signal are not synchronized. A trigger synchronization error of a demodulated asynchronous signal and the jitter of the horizontal synchronization signal itself may cause a signal-to-noise ratio of the demodulated signal to decrease. In order to avoid such problem, an embodiment of the present disclosure further optimizes the performance by using a common active clock between the touch chip and the display drive chip. Referring to FIG. 10, a circuit connection diagram of the touch display panel and the touch chip is the same as that shown in FIG. 3a. The difference is that the touch chip and the display drive chip have the common active clock, so that the strobe signal PGA_SW is synchronized with the horizontal synchronization signal Hsync in real time, avoiding a display interference interval.

By using the common active clock between the touch chip and the display drive chip, there is no trigger synchronization error of asynchronous signals, and there is no relative jitter between Hsync, Vtx, PGA_SW, and a demodulated sinusoidal reference signal, so that an upper limit of the SNR of the demodulated signal is further improved, and an overall performance is further improved.

An embodiment of the present disclosure provides an electronic device, including the touch chip in any embodiment of the present disclosure, and a touch display panel. Referring to FIG. 11a, the electronic device further includes an active clock 113, and the touch chip 112 includes the touch detection circuit in any embodiment of the present disclosure, the second PLL frequency multiplier circuit 1103 and the second system clock 1104. The display drive chip 111 includes the first PLL frequency multiplier circuit 1101 and the first system clock 1102. The active clock 113 external to the display drive chip 111 and the touch chip 112 outputs clock information to the first PLL frequency multiplier circuit 1101 of the display drive chip 111 and the second PLL frequency multiplier circuit 1103 of the touch chip 112, the first PLL frequency multiplier circuit 1101 outputs to the first system clock 1102, and the second PLL frequency multiplier circuit 1103 outputs to the second system clock 1104. The touch chip 112 and the display drive chip 111 has a common active clock, so that the strobe signal PGA_SW is synchronized with the horizontal synchronization signal Hsync in real time, avoiding a display interference interval, and realizing perfect synchronization between the display drive chip 111 and the touch chip 112. Real-time synchronization can be performed even when the touch display panel is off.

Another embodiment of the present disclosure also provides a schematic diagram of a synchronization circuit between a touch chip and a touch display panel. Referring to FIG. 11b, the display drive chip 111 is configured to output clock information to the second PLL frequency multiplier circuit 1103 of the touch chip 112, and the second PLL frequency multiplier circuit 1103 of the touch chip is connected to the second system clock 1104 of the touch chip 112 to realize perfect synchronization between the display drive chip 111 and the touch chip 112.

Another embodiment of the present disclosure also provides a schematic diagram of a synchronization circuit between a touch chip and a touch display panel. Referring to FIG. 11c, the touch chip 112 is configured to output clock information to the first PLL frequency multiplier circuit 1101 of the display drive chip 111, and the first PLL frequency multiplier circuit 1101 of the display drive chip 111 is connected to the second system clock 1102 to realize perfect synchronization between the display drive chip 111 and the touch chip 112.

The electronic device of the embodiment of the present disclosure takes in various forms, including but is not limited to:

(1) Mobile communication device: this type of device is characterized by mobile communication function, and its main goal is to provide voice and data communication. Such terminals include: smart phones (such as iPhone), multimedia cellphones, feature cellphones, low-end cellphones or the like.

(2) Ultra-mobile personal computer device: this type of device belongs to the category of personal computer, has computing and processing functions, and generally also has mobile Internet access characteristics. Such terminals include: PDAs, MIDs, and UMPC devices, such as iPad.

(3) Portable entertainment equipment: this type of device may display and play multimedia content. Such devices include: audio and video players (such as iPod), hand-held game consoles, e-books, smart toys and portable vehicle-mounted navigation devices.

(4) Server: equipment that provides computing services. The server includes a processor 810, a hard disk, a memory, a system bus, etc. The server is similar in architecture to a general-purpose computer. However, due to the need to provide highly reliable services, the server has high requirements in terms of processing capacity, stability, reliability, security, scalability, and manageability.

(5) Other electronic apparatuses having data interaction functions.

So far, specific embodiments of the present subject matter have been described. Other embodiments are within the scope of the appended claims. In some cases, the actions described in the claims may be performed in a different order and still achieve the desired result. In addition, the processes depicted in the accompanying drawings do not necessarily require the particular order or sequential order shown to achieve the desired result. In some embodiments, multitasking and parallel processing may be advantageous.

In the 1990s, for a technical improvement, it can be clearly distinguished whether it is an improvement in hardware (for example, an improvement in circuit structure such as diode, transistor, or switch) or an improvement in software (an improvement on method flow). However, with the development of technology, today, many method flow improvements may be regarded as direct improvements in the hardware circuit structure. Designers almost always obtain the corresponding hardware circuit structure by programming the improved method flow into the hardware circuit. Therefore, it cannot be said that an improvement on the method flow cannot be realized by a hardware entity module. For example, a programmable logic device (PLD) (such as a field programmable gate array (FPGA)) is such an integrated circuit whose logic function is determined by the user programming the device. Designers themselves may program to "integrate" a digital system on a piece of PLD, without having to ask a chip manufacturer to design and manufacture a dedicated integrated circuit chip. Moreover, nowadays, instead of manufacturing integrated circuit chips manually, this programming is also mostly implemented using "logic compiler" software, which is similar to the software compiler used in program development and writing. To compile the original source code, it has to be written in a specific programming language, which is called hardware description language (HDL). There is not only one type of HDL, but many types, such as ABEL (Advanced Boolean Expression Language), AHDL (Altera Hardware Description Language), Confluence, CUPL (Cornell University Programming Language), HDCal, JFIDL (Java Hardware Description Language), Lava, Lola, MyHDL, PALASM, or RHDL (Ruby Hardware Description Language). Currently the most commonly used are VHDL (Very-High-Speed Integrated Circuit Hardware Description Language) and Verilog. Those skilled in the art should also be clear that as long as the method flow is slightly logical programmed and programmed into the integrated circuit using the above-mentioned several hardware description languages, a hardware circuit that implements the logic method flow may be easily obtained.

A controller may be implemented in any suitable method, for example, the controller may take the form of a microprocessor or processor and a computer-readable medium storing computer-readable program codes (such as software or firmware) executable by the (micro) processor, logic gate, switch, application specific integrated circuit (ASIC), programmable logic controller, and embedded microcontroller. Examples of the controller include, but are not limited to, the following microcontrollers: ARC 625D, Atmel AT91SAM, Microchip PIC18F26K20 and Silicone Labs C8051F320. A memory controller may also be implemented as part of the control logic for the memory. Those skilled in the art also know that, in addition to implementing the controller in the purely computer-readable program code method, it is entirely possible to logical program method steps to make the controller achieve the same functions in the form of logic gate, switch, application specific integrated circuit, programmable logic controller, and embedded microcontroller. Therefore, such controller may be regarded as a hardware component, and an apparatus for implementing various functions included in the controller may also be regarded as a structure within the hardware component. Or even, the apparatus for implementing various functions may be regarded as both a software module implementing the method and a structure within the hardware component.

The system, apparatus, module, or unit described in the foregoing embodiments may be specifically implemented by a computer chip or entity, or by a product having a certain feature. A typical implementation device is a computer. Specifically, the computer may be, for example, a personal computer, a laptop computer, a cellular phone, a camera phone, a smart phone, a personal digital assistant, a media player, a navigation device, an email device, a game console, a tablet computer, a wearable device, or a combination of any of these devices.

For the convenience of description, when describing the above apparatus, the apparatus is divided into various units by function and described separately. Of course, when implementing the present disclosure, the functions of the units may be implemented in the same or a plurality of software and/or hardware.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage mediums (including but not limited to disk memory, CD-ROM, optical memory, etc.) containing computer-usable program codes.

The present disclosure is described with reference to flowcharts and/or block diagrams of the method, device (system), and computer program product according to the embodiments of the present disclosure. It should be understood that each flow and/or block in the flowcharts and/or block diagrams, and combinations of flows and/or blocks in the flowcharts and/or block diagrams may be implemented by computer program instructions. These computer program instructions may be provided to a processor of a general-purpose computer, dedicated computer, embedded processor, or other programmable data processing device to produce a machine, such that instructions executed by the processor of the computer or other programmable data processing device produce an apparatus for implementing the functions specified in one or more flows in the flowcharts and/or one or more blocks in the block diagrams.

These computer program instructions may also be stored in a computer-readable memory capable of directing the computer or other programmable data processing device to operate in a specific method such that the instructions stored in the computer-readable memory produce a product that includes an instruction apparatus that implements the functions specified in one or more flows in the flowcharts and/or one or more blocks in the block diagrams.

These computer program instructions may also be loaded onto the computer or other programmable data processing device, such that a series of operation steps may be performed on the computer or other programmable device to produce a computer-implemented process, such that the instructions executed on the computer or other programmable device provide steps for implementing the functions specified in one or more flows in the flowcharts and/or one or more blocks in the block diagrams.

In a typical configuration, a computing device includes one or more processors (CPUs), an input/output interface, a network interface, and a memory.

The memory may include non-persistent memory, random access memory (RAM), and/or non-volatile memory in computer-readable medium, such as read-only memory (ROM) or flash read-only memory (flash RAM). Memory is an example of the computer-readable medium.

Computer-readable medium includes both permanent and non-persistent, removable and non-removable media. Information may be stored by any method or technology. Information may be computer-readable instructions, data structures, program modules, or other data. Examples of computer storage medium include, but are not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory or other memory technologies, read-only disc read-only memory (CD-ROM), digital versatile disc (DVD) or other optical storage, magnetic tape cartridges, magnetic tape, magnetic disk storage or other magnetic storage devices, or any other non-transmission medium that may be used to store information that can be accessed by the computing device. As defined herein, the computer-readable medium does not include transitory computer-readable media (transitory media) such as modulated data signals and carrier waves.

It should also be noted that the terms "including," "comprising," or any other variation thereof are intended to encompass non-exclusive inclusion, such that a process, method, product, or device that includes a series of elements includes not only those elements but also other elements not explicitly listed, or those that are inherent to such process, method, product, or device. Without more restrictions, elements defined by the sentence "including a . . . " do not exclude the existence of other identical elements in the process, method, product or device including the said elements.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage mediums (including but not limited to disk memory, CD-ROM, optical memory, etc.) containing computer-usable program codes.

The present disclosure may be described in the general context of computer-executable instructions executed by the computer, such as program modules. Generally, program modules include routines, programs, objects, components, data structures, etc. that perform specific transactions or implement specific abstract data types. The present disclosure may also be practiced in distributed computing environments in which transactions are executed by remote processing devices connected through communication networks. In a distributed computing environment, the program modules may be located in local and remote computer storage mediums including storage devices.

The above description is merely embodiments of the present disclosure and is not intended to limit the present disclosure. For those skilled in the art, the present disclosure may have various modifications and changes. Any modification, equivalent replacement, improvement, etc. made within the spirit and principle of the present disclosure shall be included in the scope of the claims of the present disclosure.

What is claimed is:

1. A touch detection method, the method comprising:
   receiving a real-time synchronization signal sent by a touch display panel;
   acquiring a frequency of a noise signal in a working environment of a touch chip;
   setting a frequency of a coding drive signal based on the frequency of the noise signal, generating the coding drive signal based on the frequency of the coding drive signal, and outputting the coding drive signal to a drive electrode of the touch display panel;

generating a strobe signal based on the real-time synchronization signal; and receiving a signal of a sensing electrode of the touch display panel, and outputting a detection result based on the strobe signal and the signal of the sensing electrode, wherein acquiring the frequency of the noise signal in the working environment of the touch chip, and setting the frequency of the coding drive signal based on the frequency of the noise signal comprises:

detecting intensities of noise signals at each frequency in the working environment of the touch chip, and setting the frequency of a noise signal whose intensity is lower than a preset intensity threshold in the detected noise signals to be the frequency of the coding drive signal.

2. The touch detection method according to claim 1, wherein the real-time synchronization signal is a horizontal real-time synchronization signal; and a rising edge of the horizontal real-time synchronization signal is external to a strobe interval of the strobe signal.

3. The touch detection method according to claim 2, wherein the strobe signal has a same frequency as the horizontal real-time synchronization signal, and/or a width of a single high-level interval of the strobe signal is greater than a width of a single high-level interval of the horizontal real-time synchronization signal.

4. The touch detection method according to claim 1, wherein the method further comprises:

acquiring a correlation between a noise signal caused by a display drive operation of the touch display panel and the real-time synchronization signal; and generating a trigger signal based on the correlation, wherein the trigger signal is used to determine a time period that avoids the noise signal in the real-time synchronization signal.

5. The touch detection method according to claim 4, wherein generating the strobe signal based on the real-time synchronization signal comprises:

triggering to generate the strobe signal in the time period that avoids the noise signal in the real-time synchronization signal, based on the trigger signal; and the correlation comprises that an edge position of the noise signal relative to a horizontal real-time synchronization signal is fixed and concentrated.

6. The touch detection method according to claim 4, wherein, triggering to generate the coding drive signal, based on the trigger signal.

7. The touch detection method according to claim 1, wherein the method further comprises:

amplifying a signal of a touch sensor obtained by detection;

performing additional interference signal filtering on the amplified signal of the touch sensor;

strobing and connecting a useful signal of the touch sensor in the touch display panel to an input terminal of an amplifier circuit, wherein the amplifier circuit outputs a non-zero level; and strobing and connecting a noise signal of the touch sensor in the touch display panel to another input terminal of the amplifier circuit, wherein the another input terminal of the amplifier circuit is connected to a reference voltage, and an output terminal of the amplifier circuit is at zero level.

8. The touch detection method according to claim 1, wherein the method further comprises one of the following three operations:

receiving clock information of the touch display panel, wherein the clock information is used to synchronize the strobe signal and the real-time synchronization signal;

outputting clock information to the touch display panel, wherein the clock information is used to synchronize the strobe signal and the real-time synchronization signal; and receiving clock information external to the touch display panel and the touch chip, wherein the clock information is used to synchronize the strobe signal and the real-time synchronization signal.

9. A touch detection circuit, comprising:

a synchronization signal controller, configured to receive a real-time synchronization signal sent by a touch display panel, and acquire a frequency of a noise signal in a working environment of a touch chip;

a coding signal generator, configured to set a frequency of a coding drive signal based on the frequency of the noise signal, generate the coding drive signal based on the frequency of the coding drive signal, and output the coding drive signal to a drive electrode of the touch display panel; and a signal detection strobe, configured to generate a strobe signal based on the real-time synchronization signal, and receive a signal of a sensing electrode of the touch display panel, and output a detection result based on the strobe signal and the signal of the sensing electrode, wherein the synchronization signal controller is further configured to: detect intensities of the noise signals at each frequency in the working environment of the touch chip, and set the frequency of a noise signal whose intensity is lower than a preset intensity threshold in the detected noise signals to be the frequency of the coding drive signal.

10. The touch detection circuit according to claim 9, wherein the real-time synchronization signal is a horizontal real-time synchronization signal; and a rising edge of the horizontal real-time synchronization signal is external to a strobe interval of the strobe signal.

11. The touch detection circuit according to claim 10, wherein the strobe signal has a same frequency as the horizontal real-time synchronization signal; and/or a width of a single high-level interval of the strobe signal is greater than a width of a single high-level interval of the horizontal real-time synchronization signal.

12. The touch detection circuit according to claim 9, wherein the synchronization signal controller comprises:

a correlation acquisition unit, configured to acquire a correlation between a noise signal caused by a display drive operation of the touch display panel and the real-time synchronization signal; and a signal generation unit, configured to generate a trigger signal based on the correlation, wherein the trigger signal is used to determine a time period that avoids the noise signal in the real-time synchronization signal.

13. The touch detection circuit according to claim 12, wherein the signal detection strobe is further configured to:
   trigger to generate the strobe signal in the time period that avoids the noise signal in the real-time synchronization signal, based on the trigger signal.

14. The touch detection circuit according to claim 12, wherein the correlation comprises that an edge position of the noise signal relative to a horizontal real-time synchronization signal is fixed and concentrated.

15. The touch detection circuit according to claim 9, wherein the circuit further comprises:
   an amplifier, configured to amplify a signal of a touch sensor obtained by detection; and
   a low-pass anti-alias filter, configured to perform additional interference signal filtering on the amplified signal of the touch sensor.

16. The touch detection circuit according to claim 15, wherein the signal detection strobe is further configured to:
   strobe and connect a useful signal of the touch sensor in the touch display panel to an input terminal of an amplifier circuit, wherein the amplifier circuit outputs a non-zero level; and
   strobe and connect a noise signal of the touch sensor in the touch display panel to another input terminal of the amplifier circuit, wherein the another input terminal of the amplifier circuit is connected to a reference voltage, and an output terminal of the amplifier circuit is at zero level.

17. A touch chip, comprising:
the touch detection circuit, wherein the touch detection circuit comprises:
   a synchronization signal controller, configured to receive a real-time synchronization signal sent by a touch display panel, and acquire a frequency of a noise signal in a working environment of a touch chip;
   a coding signal generator, configured to set a frequency of a coding drive signal based on the frequency of the noise signal, generate the coding drive signal based on the frequency of the coding drive signal, and output the coding drive signal to a drive electrode of the touch display panel; and
   a signal detection strobe, configured to generate a strobe signal based on the real-time synchronization signal, and receive a signal of a sensing electrode of the touch display panel, and output a detection result based on the strobe signal and the signal of the sensing electrode,
wherein the synchronization signal controller is further configured to: detect intensities of the noise signals at each frequency in the working environment of the touch chip, and set the frequency of a noise signal whose intensity is lower than a preset intensity threshold in the detected noise signals to be the frequency of the coding drive signal.

* * * * *